United States Patent
Okada

(10) Patent No.: US 7,692,567 B2
(45) Date of Patent: Apr. 6, 2010

(54) DIGITAL-TO-ANALOG CONVERTER AND DISTORTION CORRECTION CIRCUIT

(75) Inventor: Kengo Okada, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 93 days.

(21) Appl. No.: 12/213,196

(22) Filed: Jun. 16, 2008

(65) Prior Publication Data

US 2008/0316073 A1 Dec. 25, 2008

(30) Foreign Application Priority Data

Jun. 21, 2007 (JP) ............... 2007-163933

(51) Int. Cl.
*H03M 1/10* (2006.01)
*H03M 3/00* (2006.01)

(52) U.S. Cl. .................. 341/120; 341/143; 341/152

(58) Field of Classification Search .......... 341/118, 341/120, 143, 152
See application file for complete search history.

(56) References Cited

U.S. PATENT DOCUMENTS 5,061,925 A * 10/1991 Sooch et al. ............... 341/120

| | | | |
|---|---|---|---|
| 6,795,004 B2 * | 9/2004 | Masuda et al. | 341/143 |
| 6,982,593 B2 * | 1/2006 | Robinson et al. | 330/10 |
| 7,221,297 B2 * | 5/2007 | Ohkuri et al. | 341/120 |
| 2004/0051654 A1 | 3/2004 | Ohkuri et al. | |
| 2004/0222907 A1 * | 11/2004 | Kranz | 341/143 |

FOREIGN PATENT DOCUMENTS

JP 3772970 2/2006

* cited by examiner

*Primary Examiner*—Howard Williams
(74) *Attorney, Agent, or Firm*—McGinn IP Law Group PLLC

(57) ABSTRACT

Disclosed is a D/A converter including: a delta-sigma modulator for subjecting a digital signal to delta-sigma modulation; a pulse-width modulator for outputting a pulse-width-modulated signal having a pulse width conforming to a digital value that is output from the delta-sigma modulator; and a distortion detector for detecting a distortion component produced in the pulse-width modulator. The distortion detector includes a delay controller for receiving the digital signal and correcting the phase thereof; a second delta-sigma modulator; a second pulse-width modulator; a subtractor for subtracting the output of the second delta-sigma modulator from the output of the second pulse-width modulator; and a second subtractor for subtracting the output signal of the first subtractor from the output signal of the delay controller.

17 Claims, 15 Drawing Sheets

FIG.11 COMPARATIVE CASE

DIGITAL-TO-ANALOG CONVERTER AND DISTORTION CORRECTION CIRCUIT

REFERENCE TO RELATED APPLICATION

This application is based upon and claims the benefit of the priority of Japanese patent application No. 2007-163933, filed on Jun. 21, 2007, the disclosure of which is incorporated herein in its entirety by reference thereto.

FIELD OF THE INVENTION

This invention relates to a digital-to-analog converter and, more particularly, to a circuit arrangement ideal for correcting distortion in a digital-to-analog converter that outputs a pulse-width-modulated signal.

BACKGROUND OF THE INVENTION

It is known to make use of a circuit that outputs a pulse-width-modulated signal as a digital-to-analog converter (D/A converter). The circuit outputs a pulse-width-modulated signal having a width conforming to the digital value of a digital signal. An overview of a D/A converter of this type will be described with reference to the teachings of Patent Document 1. FIGS. 13 to 15 are excerpted from Patent Document 1. With reference to FIG. 13, the output digital signal of a ΔΣ modulating circuit 4 is supplied to a pulse-width modulation (PWM) circuit 5 constituting a D/A converter. The PWM circuit 5 outputs a pulse-width-modulated signal having pulse widths the number which conforms to the number of bits of the digital signal input thereto. For example, if the input digital signal has three bits, the PWM circuit 5 outputs a pulse-width-modulated signal having seven types of pulse widths conforming to the digital value.

A distortion correction component generating circuit 3 generates a component Dn, which is for correcting harmonic distortion produced in the PWM circuit 5, from the input signal. A phase correcting circuit 10 outputs a signal Dc, which is obtained by applying a phase correction to the input signal, in such a manner that the signal Dc will be exactly opposite in phase to the distortion correction component Dn generated by the distortion correction component generating circuit 3. A subtractor 2 subtracts Dd from Dc, thereby diminishing beforehand a component corresponding to distortion produced in the PWM circuit 5.

The distortion correction component generating circuit 3 is adapted to artificially generate the harmonic component of the input signal by computation. The phase correcting circuit 10 has a characteristic that is opposite in phase to that of the signal produced by the distortion correction component generating circuit 3.

FIG. 14 illustrates an example of configurations of the phase correcting circuit 10 and distortion correction component generating circuit 3 in a case where second-order harmonic distortion of a reproduced signal generated by the PWM circuit 5 is removed (see FIG. 2 in Patent Document 1). Specifically, in this example, the phase correcting circuit 10 has a delay circuit 11 for applying a delay commensurate with one sample of an input digital audio signal Di. The phase correcting circuit 10 has a transfer function Ha, given as follows:

$$Ha = Z^{-1},$$

where $Z^{-1}$ represents delay of one sample by a Z function. The distortion correction component generating circuit 3 has a multiplier 31, an amplifier 32, one-sample delay circuits 33 and 35 and subtractor circuits 34 and 36. The distortion correction component generating circuit 3 has a transfer function He, which can be written as follows:

$$He = \alpha \cdot x^2 \cdot (1 - Z^{-1})^2$$

where α is a constant, x is the value of the input digital signal and $Z^{-1}$ represents delay of one sample by a Z function.

Harmonic distortion of a reproduced signal component is produced in the PWM circuit 5, with second-order harmonic distortion being the largest. Even when the normalized frequency is high, the arrangement shown in FIG. 13 is capable of sufficiently suppressing second-harmonic distortion produced in the PWM circuit 5 from the reproduced signal component.

FIG. 15 illustrates an example of the configuration of a D/A converter for removing a plurality of harmonic distortions (see FIG. 8 in Patent Document 1). The distortion correction component generating circuit 3 has distortion correction component generators 301, 302, . . . and 30m for generating distortion correction components corresponding to m-number (where m is an integer equal to or greater than 2) of n-order harmonic distortions such as second-order distortion, third-order distortion, and so on. The distortion correction component generators 301, 302, . . . and 30m have respective ones of transfer functions He1, He2, . . . and Hem for generating distortion correction components Dn1, Dn2, . . . and Dnm for removing, from a digital signal Di from an input terminal 1, harmonic distortions of corresponding orders among m-number of orders of harmonics produced in the PWM circuit 5. The distortion correction components Dn1, Dn2, . . . and Dnm from the distortion correction component generators 301, 302, . . . and 30m are supplied to an adder circuit 310. The adder circuit 310 generates a distortion correction component Dn as the output of the sum of the m-number of distortion correction components Dn1, Dn2, . . . and Dnm, and supplies the distortion correction component Dn to the subtractor circuit 2, which subtracts Dn from the digital signal from phase correcting circuit 10. The phase correcting circuit 10 has phase correction units 101, 102, . . . and 10m for correcting the phase characteristics of the input digital signal Di so as to conform to the phase characteristics of the m-number of distortion correction component generators 301, 302, . . . and 30m. The phase correction units 101, 102, . . . and 10m have respective ones of transfer functions Ha1, Ha2, . . . and Ham for correcting the phase of the input digital signal Di in such a manner that, irrespective of the normalized frequency, the m-number of n-order harmonic distortions produced in the PWM circuit 5 with regard to the input digital signal Di will be opposite in phase in PWM circuit 5 with respect to distortion correction components Dn1, Dn2, . . . and Dnm obtained through the subtractor circuit 2. Phase-corrected digital signals Dc1, Dc2, . . . Dcn from the phase correction units 101, 102, . . . and 10m are supplied to an adder circuit 310. The adder circuit 310 generates a digital signal Dc, the amplitude and phase of which have been corrected, as the output of the sum of the m-number of digital signals Dc1, Dc2, . . . and Dcn, and supplies the digital signal Dc to the subtractor circuit 2, thereby removing a plurality of n-order harmonic distortions.

[Patent Document 1]
JP Patent No. 3772970 (Japanese Patent Kokai Publication No. JP-P2003-133959A)

SUMMARY OF THE DISCLOSURE

The following analyses are given by the present invention. The D/A converter of the related art described with reference to FIGS. 13 to 15 has certain problems, described below. These problems have been discovered based upon investigations by the present inventor.

Although harmonic distortion can be reduced, an adjusting operation becomes necessary in order to decide coefficients for generating accurate distortion components, by way of example.

Specifically, with the distortion correction component generating circuit 3 (see FIG. 14), a distortion component is generated artificially by computation. Consequently, it is required that the circuit be adjusted in conformity with the level of harmonic. distortion produced in an actual circuit.

Further, since one distortion is dealt with using one correction circuit, design of a plurality of correction circuits is necessary in order to deal with components of a plurality of orders (see FIG. 15).

Usually, harmonic distortions are produced in a plurality of orders. Since correction circuits corresponding to respective ones of the orders are required, the circuitry inevitably becomes more complicated and the items to be adjusted increase if there is an increase in the orders to be corrected.

Furthermore, the multiplier 31 is provided in order to square the input signal (see FIG. 14). In a case where harmonic distortions of a plurality of orders are reduced, the phase correcting circuit 10 (see FIG. 13) becomes more complicated. Further, a squaring circuit is necessary in order to generate a harmonic, and there are cases where application is subjected to limitations in terms of circuit area and power consumption.

The invention disclosed in this application has the structure set forth below in order to solve the foregoing problems.

A distortion correction circuit according to one aspect of the present invention comprises: a first circuit for outputting a signal obtained by applying signal processing to an input signal; a second circuit disposed in front of the first circuit and having a configuration identical with or equivalent to that of the first circuit in relation to the signal processing, the second circuit receiving the input signal and subjecting the signal to signal processing; wherein an output signal from the second circuit includes a distortion component equivalent to a distortion component produced in a case where the input signal is supplied to the first circuit; and further comprising a circuit for extracting a signal, which includes a distortion component and from which the input signal component has been excluded, from the output signal of the second circuit; wherein a signal obtained by subtracting the extracted signal (distortion signal) containing the distortion component from the input signal is supplied to the first circuit, and the first circuit outputs a signal corrected for the distortion component.

A distortion correction circuit according to another aspect of the present invention comprises: a first circuit for outputting a signal obtained by applying signal processing to an input signal; switching circuits for switching an input and output, respectively, of the first circuit and controlling switching so as to cause the first circuit to perform distortion detection and signal processing in time-shared fashion; wherein the input signal is input first of all to the first circuit by the switching circuits, the input signal is subjected to signal processing by the first circuit and the output signal of the first circuit is fed back; and further comprising a circuit, which is provided in the feedback path, for extracting a signal, which includes a distortion component and from which the input signal component has been excluded, from the output signal of the first circuit; wherein a signal obtained by subtracting the extracted signal (distortion signal) containing the distortion component from the input signal is supplied to the first circuit, and the first circuit outputs a signal corrected for the distortion component.

In the present invention, the first circuit includes a pulse-width modulator for outputting a pulse-width-modulated signal having a pulse width conforming to the value of a digital signal input thereto.

In the present invention, the first circuit further includes a delta-sigma modulator for receiving the digital signal, subjecting the digital signal to delta-sigma modulation and outputting the modulated signal; wherein the output of the delta-sigma modulator is supplied to the pulse-width modulator.

A digital-to-analog converter according to a further aspect of the present invention comprises: a first delta-sigma modulator for receiving a digital signal, subjecting the digital signal to delta-sigma modulation and outputting the modulated signal; a first pulse-width modulator for receiving a digital signal, which is output from the first delta-sigma modulator, and outputting a pulse-width modulated signal having a pulse width conforming to the value of the digital signal; and a distortion detector for receiving an input digital signal and supplying an output signal to the first delta-sigma modulator.

In the present invention, the distortion detector includes: a delay controller for receiving the input digital signal, correcting the phase thereof and outputting the resultant signal; a second delta-sigma modulator for receiving the input digital signal, subjecting the input digital signal to delta-sigma modulation and outputting the modulated signal; a second pulse-width modulator for receiving a digital signal, which is output from the second delta-sigma modulator, and outputting a pulse having a pulse width conforming to the value of the digital signal; a first subtractor for subtracting the output of the second delta-sigma modulator from the output signal of the second pulse-width modulator and outputting the result of subtraction; and a second subtractor for subtracting the output of the first subtractor from the output signal of the delay controller and outputting the result of subtraction; wherein the output signal of the second subtractor is supplied to the first delta-sigma modulator.

In the present invention, the distortion detector may include: a first sampling rate converting circuit for receiving the output signal of the second delta-sigma modulator and converting a sampling rate of the output signal, wherein the first subtractor subtracts the output signal of the first sampling rate converting circuit from the output signal of the second pulse-width modulator; and a second sampling rate converting circuit for receiving the output signal of the first subtractor and converting a sampling rate of the output signal, wherein the second subtractor subtracts the output signal of the second sampling rate converting circuit from the output signal of the delay controller and outputs the result of subtraction.

In the present invention, the distortion detector may include a sampling rate converting circuit for receiving the output signal of the second pulse-width modulator and converting a sampling rate of the output signal, wherein the first subtractor subtracts the output signal of the second delta-sigma modulator from the output signal of the sampling rate converting circuit and outputs the result of subtraction.

In the present invention, the first and second delta-sigma modulators may have identical configurations, and the first and second pulse-width modulators may have identical configurations.

A digital-to-analog converter according to a yet another aspect of the present invention comprises: a delta-sigma modulator for receiving a digital signal, subjecting the digital signal to delta-sigma modulation and outputting the modulated signal; a pulse-width modulator for receiving a digital signal, which is output from the delta-sigma modulator, and outputting a pulse-width modulated signal having a pulse width conforming to the value of the digital signal; a delay controller for receiving the input digital signal, correcting the phase thereof and outputting the resultant signal; a first subtractor for subtracting the output of the pulse-width modulator from the output signal of the delta-sigma modulator and outputting the result of subtraction; a second subtractor for subtracting the output of the first subtractor from the output signal of the delay controller and outputting the result of subtraction; a first changeover switch for selecting one of the input digital signal and output signal of the second subtractor and inputting the selected signal to the delta-sigma modulator; and a second changeover switch for delivering the output signal of the pulse-width modulator to one of an output buffer and the first subtractor.

In the present invention, the digital-to-analog converter further comprises a first sampling rate converting circuit for receiving the output signal of the delta-sigma modulator and converting a sampling rate of the output signal, wherein the first subtractor subtracts the output signal of the first sampling rate converting circuit from the output signal of the pulse-width modulator; and a second sampling rate converting circuit for receiving the output signal of the first subtractor and converting a sampling rate of the output signal, wherein the second subtractor subtracts the output signal of the second sampling rate converting circuit from the output signal of the delay controller and outputs the result of subtraction.

In the present invention, the first sampling rate converting circuit includes an interpolation filter and the second sampling rate converting circuit includes a decimation filter.

In the present invention, the digital-to-analog converter may further comprise a sampling rate converting circuit for receiving the output signal of the pulse-width modulator and converting a sampling rate of the output signal, wherein the first subtractor subtracts the output signal of the delta-sigma modulator from the output signal of the sampling rate converting circuit and outputs the result of subtraction.

In the present invention, the sampling rate converting circuit includes a decimation filter.

The meritorious effects of the present invention are summarized as follows.

In accordance with the present invention, harmonic components can be removed by a simple arrangement without requiring an adjusting operation for performing a distortion correction accurately.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

PREFERRED MODES OF THE INVENTION

The present invention will be described in greater detail with reference to the accompanying drawings. Specifically, the present invention provides a D/A converter that employs pulse-width modulation (PWM) and is adapted to suppress the distortion that accompanies PWM. This is achieved by performing distortion detection using delta-sigma ($\Delta\Sigma$) modulation (DSM) and PWM identical with that of the actual signal processing path. This makes it possible to detect distortion components that are entirely the same as distortion components produced.

Figure 2:
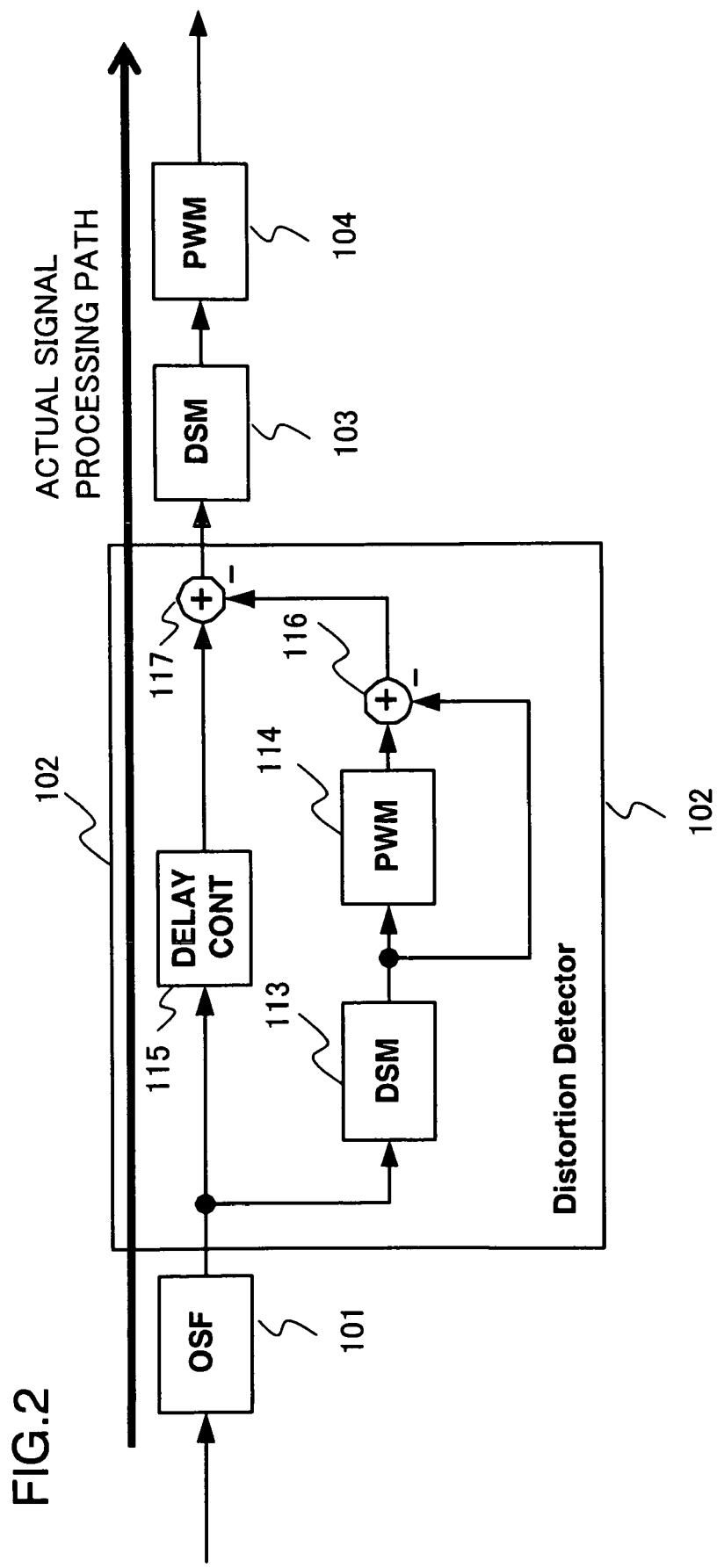
FIG. 2 is a diagram illustrating the configuration of a distortion detector according to the exemplary embodiment.

In the circuit according to one mode of the present invention, as illustrated in FIG. 2, a first circuit (DSM 103, PWM 104) outputs a signal obtained by applying signal processing to an input signal. A second circuit (DSM 113, PWM 114) equivalent to the first circuit (DSM 103, PWM 104) is provided as a distortion detector in front of the first circuit (DSM 103, PWM 104). The second circuit (DSM 113, PWM 114) receives the input signal and subjects the signal to signal processing. The output signal of the second circuit (DSM 113, PWM 114) includes a distortion component equivalent to a distortion component (e.g., a harmonic component of the input signal) contained in the output signal of the first circuit (DSM 103, PWM 104) in a case where the input signal is supplied to the first circuit (DSM 103, PWM 104). A signal, which contains the distortion component and from which the input signal component has been excluded, is extracted from the output signal of the second circuit (DSM 113, PWM 114), and a signal obtained by subtracting the extracted signal including the distortion component from the input signal is supplied to the first circuit (DSM 103, PWM 104). A signal corrected for the distortion component (e.g., a harmonic component of the input signal) (a signal in which the distortion component has been suppressed or eliminated) is output from the output section (PWM 104) of the first circuit.

In accordance with the present invention, all harmonic distortions can be dealt with by a distortion detector of a single set of circuits (DSM, PWM).

Furthermore, in accordance with the present invention, the circuit (DSM, PWM) in the actual signal processing path is used as the distortion detector. By adopting this arrangement, it is unnecessary to design the distortion detector anew. In accordance with the present invention, it is unnecessary to design the transfer function of the distortion detector. This contributes to a reduction in design time and man-hour requirement.

In the present invention, removal of distortion components is carried out prior to DSM, which is performed by the circuit in the actual signal processing path.

In the present invention, characteristics can be improved without an attendant deterioration in the noise shaping characteristic and increase in clock frequency required for PWM conversion.

In general, when there is an increase in PWM resolution, there is also an increase in the clock frequency required, and PWM resolution is set low for this reason.

In order to lower resolution, it is necessary to reduce the bit width of the input signal as well. Therefore, bit width is lowered while maintaining quality within the signal band using DSM.

Consequently, in a case where distortion detection and correction are carried out after DSM, the resolution of distortion components that can be expressed declines, effective removal of distortion becomes more difficult and there is the likelihood that the noise shaping characteristic will deteriorate and that there will be an increase in the clock frequency, which is necessary for PWM processing, owing to an increase in bit width.

By contrast, in accordance with the present invention, excellent correction for distortion can be performed independently of the configuration of the PWM conversion scheme, transfer function of DSM (ΔΣ modulation), signal sampling frequency and bit width.

Figure 6:
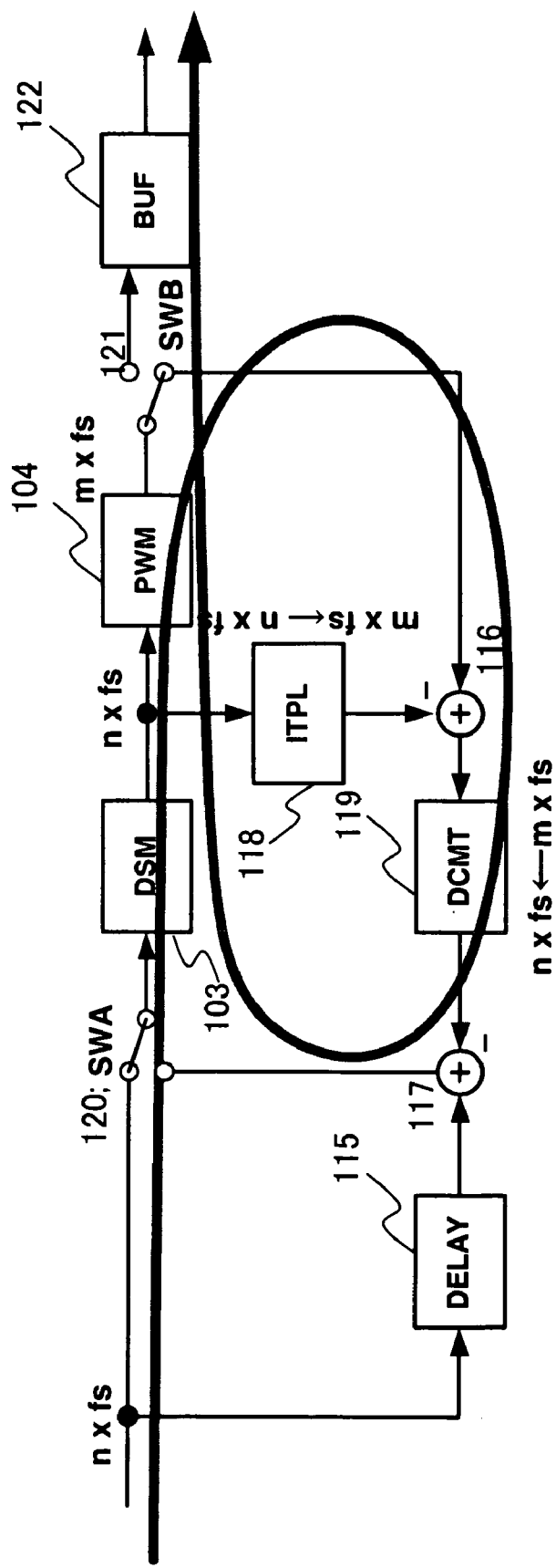
FIG. 6 is a diagram illustrating the configuration of a third example of the present invention.

The present invention is not limited to an arrangement in which two sets of the same circuit (DSM, PWM) are provided as DSM and PWM. In another mode of the present invention, there may be provided such an arrangement in which a single set of the circuit (DSM, PWM) is utilized in time-shared fashion. In another mode of the circuit according to the present invention, as illustrated in FIG. 6, a first circuit (DSM, PWM) outputs a signal obtained by applying signal processing to an input signal. Switching circuits (SWA, SWB) are provided for switching an input and output, respectively of the first circuit (DSM, PWM) and controlling switching so as to cause the first circuit (DSM, PWM) to perform distortion detection and signal processing in time-shared fashion. First, the input signal is supplied to the first circuit (DSM, PWM) by the switching circuits, the input signal is subjected to signal processing by the first circuit (DSM, PWM) and the output signal of the first circuit is fed back. In the feedback path, a signal, which includes a distortion component and from which the input signal component has been excluded, is extracted from the output signal of the first circuit (this is a distortion detection cycle). Next, a signal obtained by subtracting the distortion component produced in the first circuit (DSM, PWM) from the input signal is supplied to the first circuit (DSM, PWM). A signal corrected for the distortion component (e.g., a harmonic component of the input signal) (a signal in which the distortion component has been suppressed or eliminated) is output from the output section (PWM) of the first circuit. Described below is an embodiment in which the present invention is applied to an oversampling-type D/A converter in a digital audio reproducing apparatus.

Figure 1:
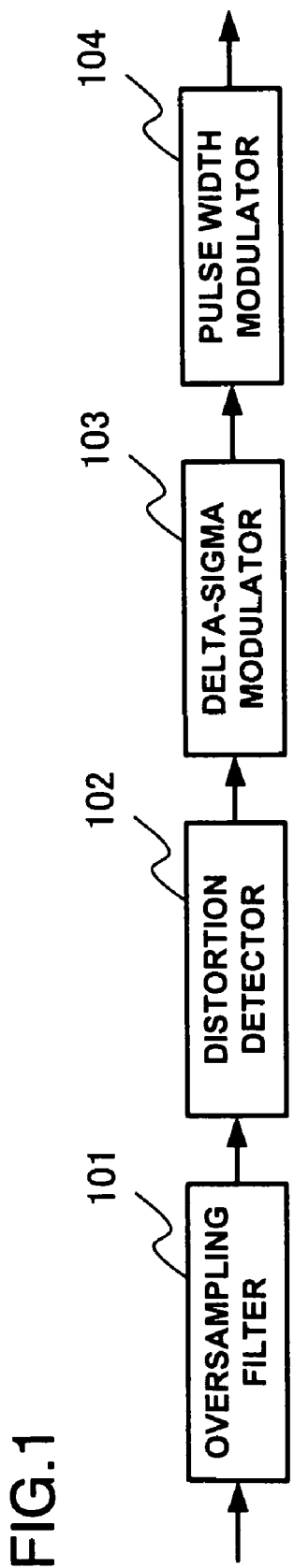
FIG. 1 is a diagram useful in describing the overall configuration of an exemplary embodiment of the present invention.

FIG. 1 is a diagram illustrating the overall configuration of an exemplary embodiment of the present invention. In this embodiment, an output signal of an oversampling filter (OSF) 101 is supplied to a distortion detector 102 according to the present invention. The OSF 101 samples data at a frequency that is n times the original sampling frequency fs (namely at a frequency n×fs). The output of the distortion detector 102 is supplied to a DSM (Delta-Sigma Modulator) 103. The DSM 103 integrates the difference between an output code and an input code and outputs a code in such a manner that the result of integration is minimized. The output of the DSM 103 is supplied to a PWM (Pulse-Width Modulator) 104. In the frequency spectrum characteristic of the DSM 103, quantization noise components are distributed on a high-frequency side to implement a noise shaping characteristic. It should be noted that the output of the PWM 104 drives a speaker via a driver amplifier and smoothing circuit, none of which are illustrated.

The DSM 103 reduces the number of bits of the input digital signal and shifts quantization noise to a high-frequency side. For example, by applying third-order noise shaping to a 24-bit digital audio signal, the DSM 103 outputs a digital signal of three to eight bits.

FIG. 2 is a diagram illustrating the configuration of an example of the distortion detector 102 of FIG. 1 in the form of a signal flow diagram. As shown in FIG. 2, the distortion detector 102 includes a delay controller 115, a DSM (ΔΣ modulator) 113, a PWM 114, a subtractor 116 for subtracting the output signal (a feed-forward signal) of the DSM 113 from the output signal of the PWM 114, and a subtractor 117 for subtracting the output signal of the subtractor 116 from the output signal of the delay controller 115.

The subtractor 117 generates a difference signal indicative of the difference between the input signal and a signal obtained by performing ΔΣ modulation and PWM processing equivalent to that of the actual signal path (that is, the subtractor 117 extracts a harmonic distortion component).

The delay controller 115 corrects for a delay in distortion detection ascribable to the DSM 113, PWM 114 and subtractor 116. It should be noted that the subtractor 116 is also an adder that adds the output signal of the . PWM 114 and a signal the phase of which is opposite that of the output signal of DSM 113. Similarly, the subtractor 117 is an adder that adds the output of the delay controller 115 and a signal the phase of which is opposite that of the output signal of the subtractor 116.

The subtractor 117 subtracts the output signal of the distortion detector 102 from the output signal of the OSF 101 and supplies a resultant signal of the subtraction to the DSM 103 in the actual signal path.

Figure 3:
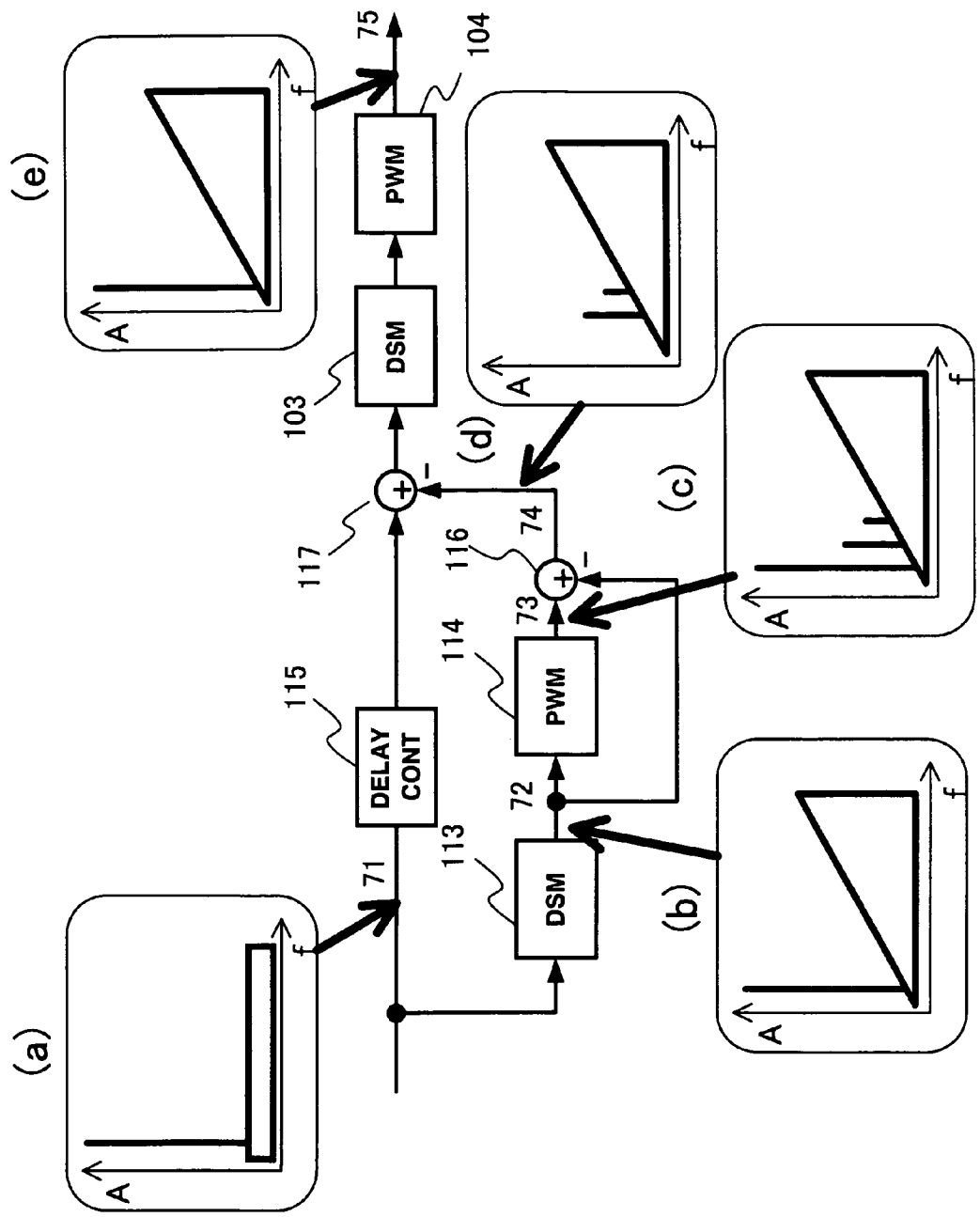
FIG. 3 is a diagram schematically illustrating spectrum characteristics of frequency domains of signals at typical nodes of the distortion detector shown in FIG. 2.

FIG. 3 is a diagram schematically illustrating the spectrum characteristics of frequency domains at nodes of the distortion detector shown in FIG. 2. Spectrum characteristics (a) to (e) in FIG. 3 are illustrated as power spectrums (spectrum intensities) obtained by converting time-domain signals at corresponding nodes 71 to 75, respectively, to frequency domains by a DFT (Discrete Fourier Transform) or FFT (Fast-Fourier Transform).

The output of the OSF 101 in FIG. 1, i.e., the frequency component at the input node (71 in FIG. 3) of the delay controller 115, contains a signal spectrum and noise components (quantization noise, etc.), as indicated by the spectrum characteristic (a) in FIG. 3. It should be noted that quantization noise is uniformly distributed up to the Nyquist frequency (n×fs/2). It is known that noise power per unit frequency decreases in inverse proportion to the sampling frequency. The spectrum intensity of quantization noise is reduced to 1/n of that in the case of a sampling frequency fs by oversampling (n×fs).

The quantization noise is shifted in the direction of higher frequency at the output node (72 in FIG. 3) of the 113, as indicated by the spectrum characteristic (b) of FIG. 3. Spectrum intensity on the low-frequency side declines. In the spectrum characteristic (b), the noise-component spectrum is represented as a right triangle.

Harmonic components of the signal appear at the output (73 in FIG. 3) of the PWM 114, as indicated by the spectrum characteristic (c) of FIG. 3. In the spectrum characteristic (c) of FIG. 3, only the signal component and spectrums of second- and third-order harmonic components are illustrated. Spectrum intensities of fourth-order harmonics and higher are below the noise-shaped noise level and there are not illustrated.

The signal component is cancelled out and vanishes and the harmonic components (of the second order, third order and so forth) remain at the output (74 in FIG. 3) of the subtractor 116, as indicated by the spectrum characteristic (d) of FIG. 3. It should be noted that since the noise components are uncorrelated (random), they remain and are not cancelled out even by subtraction by the subtractor 116. For example, positive- and negative-phase signals are not cancelled out by subtraction.

The signal spectrum and the harmonic components and opposite-phase harmonic components, which components are included at the output node (74 in FIG. 3) of the subtractor 116, remain at the output of the subtractor 117 as frequency components of the signal obtained by subtracting, in the time domain, the output signal [spectrum characteristic (d)] of the subtractor 116 from the signal [spectrum characteristic (a)] obtained by delaying the input signal by the delay controller 115.

This is subjected to ΔΣ modulation by the DSM 103 and to PWM by the PWM 104. The spectrum characteristic at the output node (75 in FIG. 3) of the PWM 104 is as illustrated at (e) of FIG. 3. Harmonic components do not appear in the characteristic. As mentioned above, the subtractor 116 and the subtractor 117 both perform signal subtraction in the time domain. The subtractors do not perform subtraction between the two spectrum characteristics in the frequency domain.

A specific example of the configuration of the distortion detector 102 illustrated in the form of a signal flow in FIG. 2 will be described below.

Figure 4:
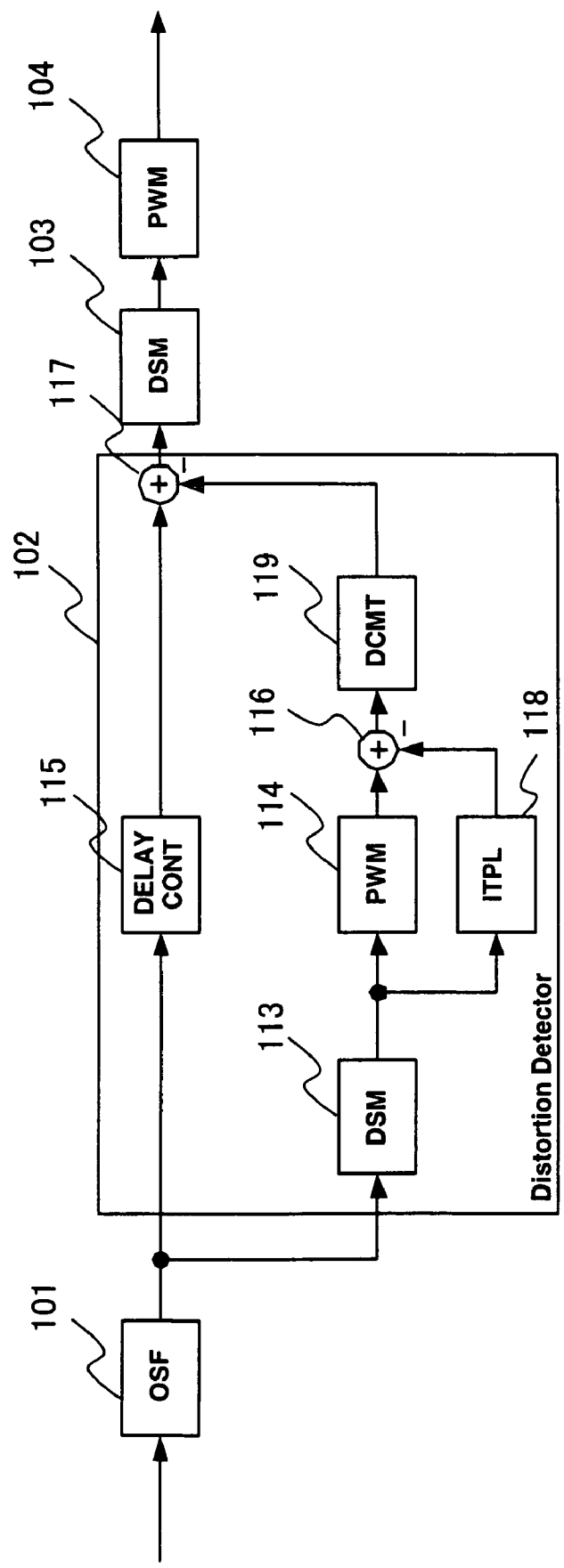
FIG. 4 is a diagram illustrating the configuration of a first example of the present invention.

FIG. 4 is a diagram illustrating the configuration of a first embodiment of the distortion detector 102. As shown in FIG. 4, the distortion detector 102 includes the DSM 113 for receiving the digital signal supplied thereto and applying delta-sigma modulation; the PWM 114 for receiving the digital signal that is output from the DSM 113 and outputting a pulse having a pulse width conforming to the value of the digital signal; an interpolation filter (ITPL) 118 for receiving the output signal of the DSM 113 and converting a sampling rate of the output signal of the DSM 113 by interpolation; the subtractor 116 for subtracting the output signal of the ITPL 118 from the output of the DSM 113; a decimation filter (DCMT) 119 for receiving the output of the subtractor 116 and converting a sampling rate of the output of the subtractor 116 by downsampling; and the delay controller 115. The output of the subtractor 117, which subtracts the output of the DCMT 119 from the output of the delay controller 115, is supplied to the DSM 103, and the output of the DSM 103 is supplied to the PWM 104. The DSM 113 applies third-order noise shaping to, e.g., a 24-bit digital audio signal, thereby outputting a digital signal of, e.g., three to eight bits. The ITPL 118 performs up-sampling of the output of the DSM 113 (the sampling frequency thereof being n×fs which is that of the OSF in FIG. 2) and makes it conform to the sampling rate (m×fs) at the PWM 114. The DCMT 119 performs down-sampling of the signal sampled at the sampling rate m×fs, thereby returning the sampling rate to n×fs.

Figure 5:
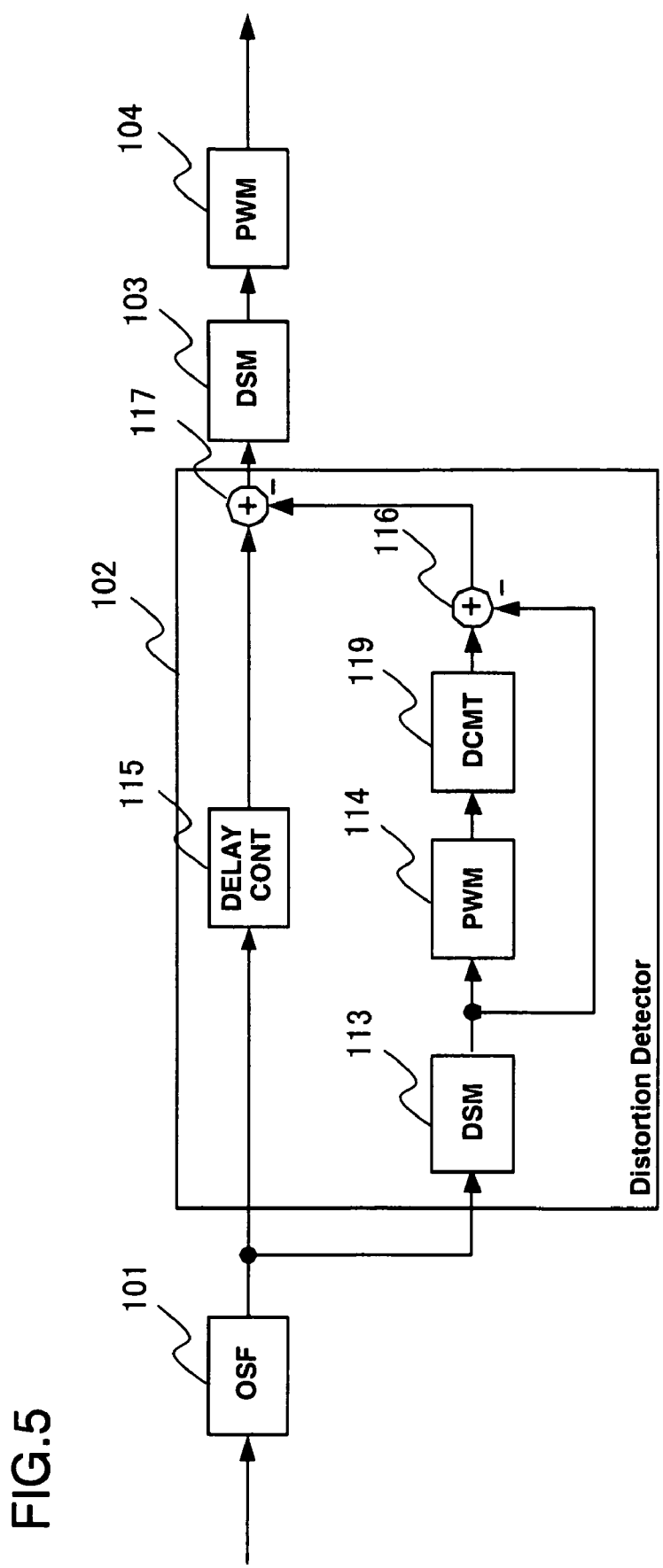
FIG. 5 is a diagram illustrating the configuration of a second example of the present invention.

FIG. 5 is a diagram illustrating the configuration of a second example of the present invention. As shown in FIG. 5, the distortion detector 102 includes the DSM 113 for receiving the digital signal input thereto and applying delta-sigma modulation; the PWM 114 for receiving the digital signal that is output from the DSM 113 and outputting a pulse having a pulse width conforming to the value of the digital signal; the decimation filter (DCMT) 119 for converting the sampling rate of the output signal from the PWM 114; the subtractor 116 for subtracting the output of the DSM 113 from the output of the DCMT 119; and the delay controller 115. The output of the subtractor 117, which subtracts the output of the DCMT 119 from the output of the delay controller 115, is supplied to the DSM 103, and the output of the DSM 103 is supplied to the PWM 104. It should be noted that the output of the DSM 113 is supplied to the subtractor 116 upon being delayed via a buffer (not shown) by a delay time equivalent to the delay imposed by the PWM 114 and DCMT 119. The arrangement shown in FIG. 5 has the buffer (not shown) provided in place of the ITPL 118 (FIG. 4), which has been deleted, and is so adapted that the output of the DSM 113 is subtracted from the DCMT 119.

In each of the above described examples, the DSM 113 and PWM 114 are provided in the distortion detector 102 separately of the DSM 103 and PWM 104. That is, two sets of the DSM and PWM are provided in each of the above described examples. However, the present invention is not limited to such an arrangement, as a matter of course. For example, a single set of DSM, PWM may be adopted and this single set may be changed over in a time-sharing manner between use for distortion detection and use for signal processing. Such an example will now be described.

Figure 7:
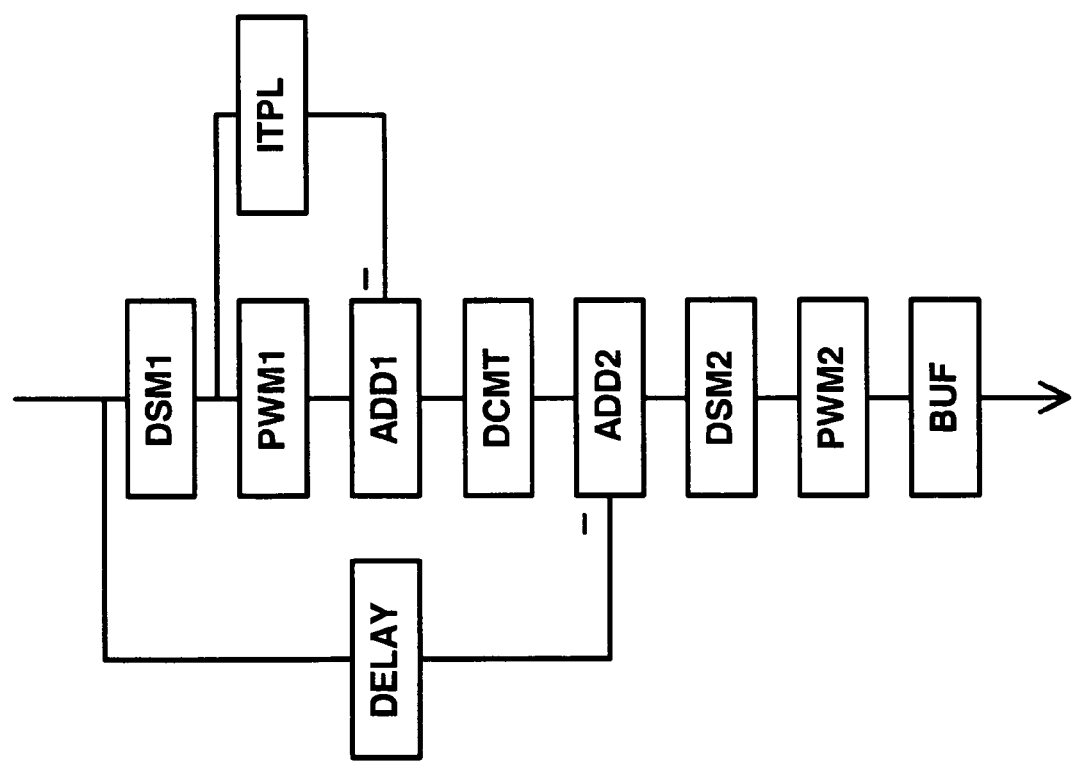
FIG. 7 is a diagram useful in describing processing according to a third example of the present invention.

FIG. 6 is a diagram illustrating the configuration of a third example of the present invention. In the above-described example shown in FIG. 4, two sets of DSM, PWM are provided, namely DSM 113, PWM 114, which constitute one set, and DSM 103, PWM 104, which constitute the second set. In the third example, a single DSM, PWM set is adopted and is used as a distortion detector in time-shared fashion. The arrows in FIG. 6 represent the signal path. It should be noted that if the circuit of FIG. 6 is implemented by, e.g., a DSP (Digital Signal Processor) or a program control processor such as a CPU, then the flowchart of FIG. 7 represents the procedure of processing in the DSP (or CPU). Further, if the circuit of FIG. 6 is implemented by a DSP (or CPU), a working memory (not shown) is connected to the DSM 103 (the working memory may be changed over in conformity with time sharing of distortion detection and actual signal processing).

As shown in FIG. 6, this example includes a changeover switch (SWA) 120, a DSM 103, a PWM 104, a changeover switch (SWB) 121, buffer 122, a delay controller 115, a subtractor 116, a DCMT 119, a subtractor 117 and an ITPL 118. The delay controller 115, subtractor 116, DCMT 119, subtractor 117 and ITPL 118 in FIG. 6 operate in the same fashion as described above in conjunction with FIG. 4.

The operation of this example will be described with reference to FIGS. 6 and 7. The input signal, which has been oversampled to n times the sampling frequency fs (namely the output signal of the OSF 101 in FIG. 1), is supplied via the changeover switch (SWA) 120 to the DSM 103, where the signal is subjected to DSM processing (DSM1 in FIG. 7). The output of the DSM 103 is supplied to the PWM 104 and ITPL 118, which execute processing PWM1 and ITPL in FIG. 7 in parallel. The output of the PWM 104 is supplied to the subtractor 116 via the changeover switch (SWB) 121. The output of the ITPL 118 is subtracted from the output of the PWM 104 at the subtracter 116 (ADD1 in FIG. 7). It should be noted that since the subtractor 116 adds the output of the PWM 104 and the reverse phased signal of the output of the ITPL 118, it is represented by addition processing (ADD1) in FIG. 7. The output of the subtractor 116 is subjected to DCMT processing by the DCMT 119. The output of the DCMT 119 is subtracted from the output (DELAY in FIG. 7) of the delay controller 115 in the subtractor 117 (ADD2 in FIG. 7). The result of the subtraction in the subtractor 117 is again input to the DSM 103 via the changeover switch (SWA) 120 and is subjected to DSM processing (DSM2 in FIG. 7). The output of the DSM 103 is supplied to the PWM 104 (PWM2 in FIG. 7). The output of the PWM 104 is delivered via the changeover switch (SWB) 121 upon being accumulated temporarily in the buffer 122. The output of the buffer 122 is connected to a speaker via a driver amplifier and smoothing circuit, none of which are illustrated, although this does not impose any specific limitation.

The ITPL 118 converts the sampling rate of n×fs to m×fs (where m>n holds) in conformity with the sampling rate of the PWM 104. The decimation filter DCMT 119 performs down-sampling from m×fs to n×fs.

If signal input/output is performed in the arrangement of FIG. 6 (which has a single set of DSM and PWM) at a rate equal to that in the case of the arrangement of FIG. 4 (which has two sets of DSM and PWM), then each circuit will be driven at an operating frequency that is double the operating frequency of the circuit of FIG. 4.

Figure 8:
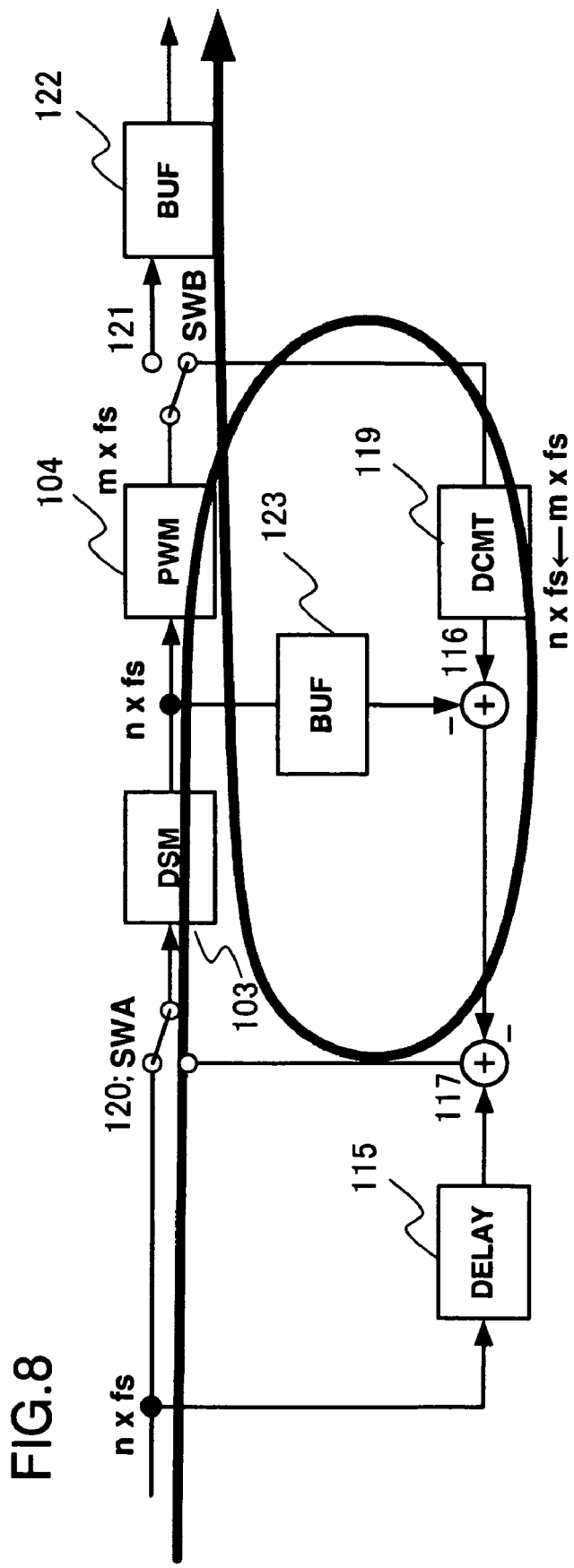
FIG. 8 is a diagram illustrating the configuration of a third example of the present invention.
Figure 9:
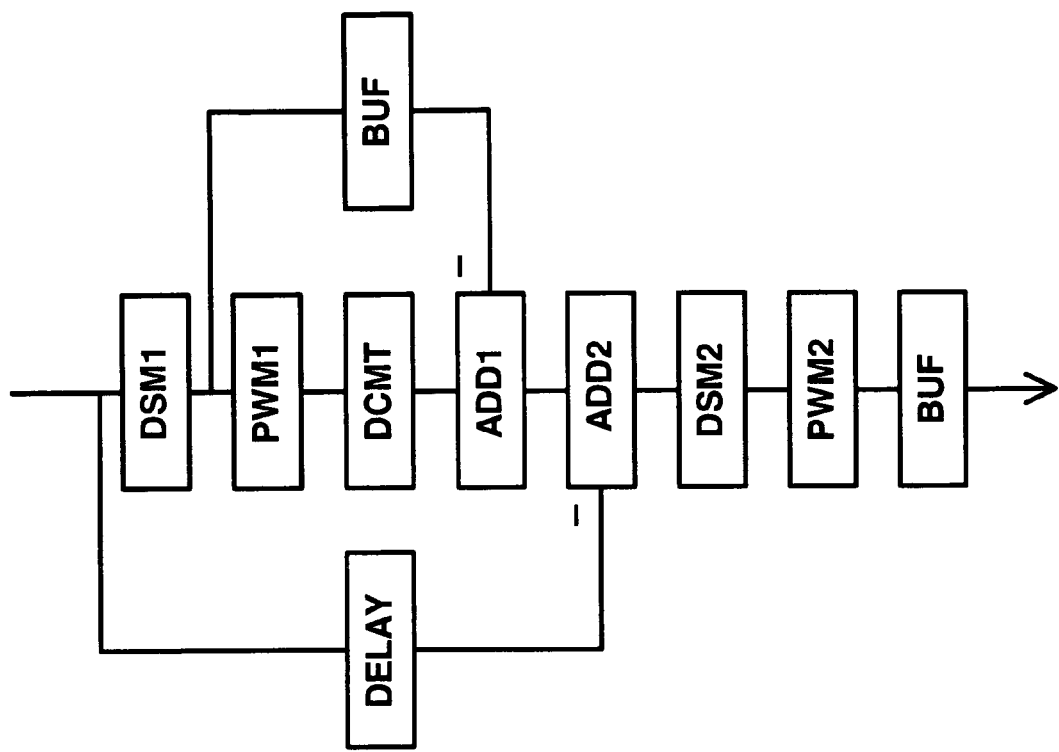
FIG. 9 is a diagram useful in describing processing according to a fourth example of the present invention.

FIG. 8 is a diagram illustrating an arrangement according to a fourth example in which a single set of DSM and PWM is used in time-shared fashion. In this example, the single set composed of DSM 103 and PWM 104 is adopted instead of the sets of DSM 113 and PWM 114 and DSM 103 and PWM 104 in FIG. 5. The arrows in FIG. 8 represent the signal path. FIG. 9 is a flowchart for describing the processing executed by the circuit of FIG. 8. It should be noted that if the circuit of FIG. 8 is implemented by, e.g., a DSP (Digital Signal Processor) or a program control processor such as a CPU, then the flowchart of FIG. 9 represents the procedure of processing in the DSP (or CPU). Further, if the circuit of FIG. 8 is implemented by a DSP (or CPU), a working memory (not shown) is connected to the DSM 103 (the working memory may be changed over in conformity with time sharing of distortion detection and actual signal processing).

As shown in FIG. 8, this example includes the changeover switch (SWA) 120, the DSM 103, the PWM 104, the changeover switch (SWB) 121, the buffer 122 and a buffer 123, the delay controller 115, the subtractor 116, the DCMT 119 and the subtractor 117. The delay controller 115, subtractor 116, DCMT 119 and subtractor 117 in FIG. 8 operate in the same fashion as described above in conjunction with FIG. 5.

The input signal, which has been oversampled to n times the sampling frequency fs, is input via the changeover switch (SWA) 120 to the DSM 103, where the signal is subjected to DSM processing (DSM1 in FIG. 9). The output of the DSM 103 is supplied to the PWM 104 and buffer (BUF) 123 (PWM1 and BUF in FIG. 9). The output (sampling rate m×fs) of the PWM 104 is supplied to the DCMT 119 via the changeover switch (SWB) 121 and the sampling rate is returned to the sampling rate n×fs (DCMT1 in FIG. 9). The output of the DCMT 119 is supplied to the subtractor 116, which proceeds to subtract the output of the buffer 123 from the output of the DCMT 119 (ADD1 in FIG. 9). Furthermore, the output of the subtractor 116 is subtracted from the output (DELAY in FIG. 9) of the delay controller 115 in the subtractor 117 (ADD2 in FIG. 9). The result of the subtraction is input via the changeover switch (SWA) 120 to the DSM 103, which executes DSM processing (DSM2 in FIG. 9). The output of the DSM 103 is supplied to the PWM 104, which executes PWM processing (PWM2 in FIG. 9). The output of the PWM 104 is delivered via the changeover switch (SWB) 121 upon being accumulated temporarily in the buffer 122. Further, the buffer 123 functions to delay the output of the DSM 103 in conformity with the processing delay of the PWM 104 and DCMT 119. The output of the buffer 122 is connected to a speaker via a driver amplifier and smoothing circuit, none of which are illustrated, although this does not impose any specific limitation.

If signal input/output is performed in the arrangement of FIG. 8 at a rate equal to that in the case of FIG. 5, then each circuit will be driven at an operating frequency that is double the operating frequency of the circuit of FIG. 5.

Figure 10:
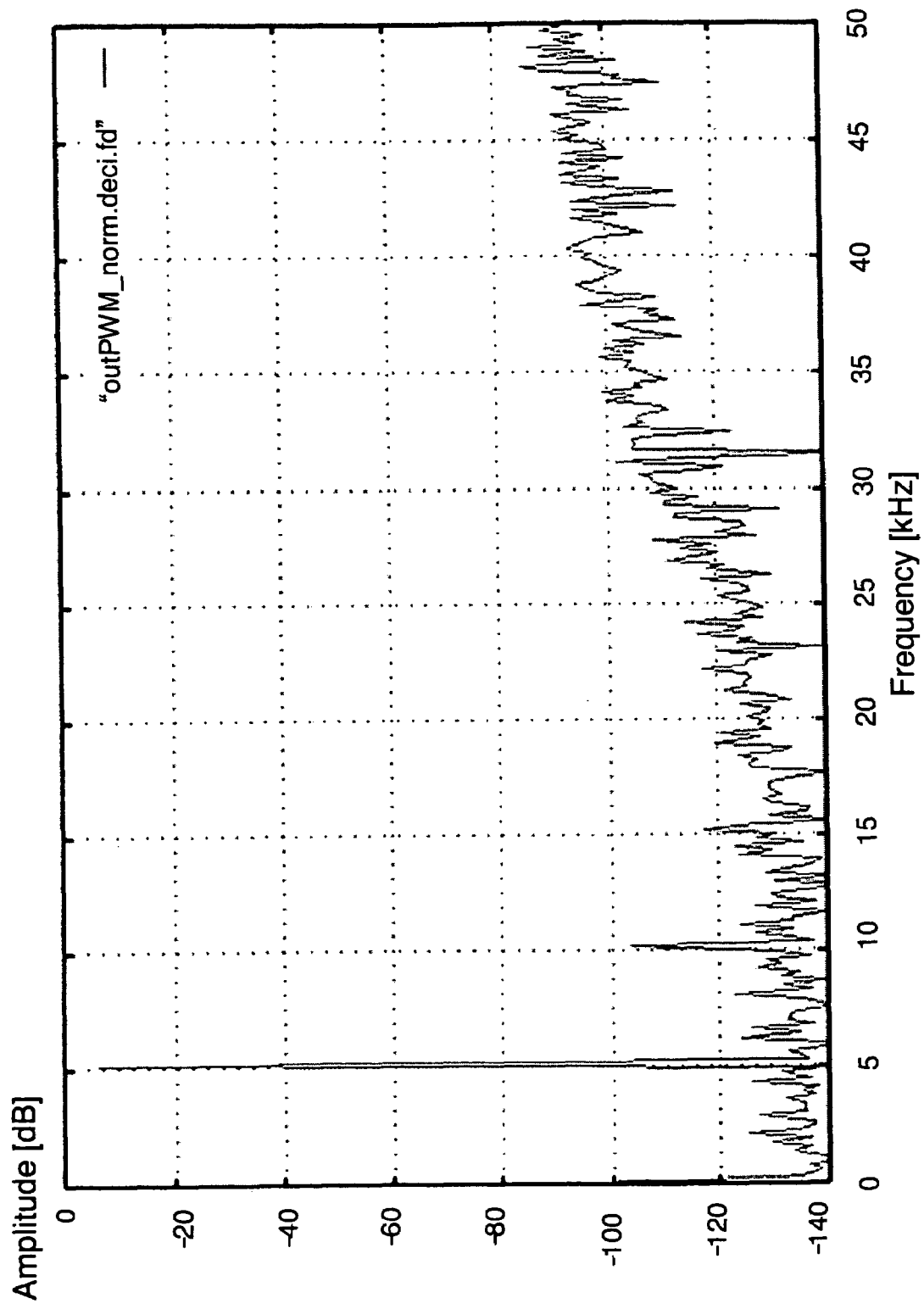
FIG. 10 is a diagram illustrating the result of a simulation in a comparative example.
Figure 11:
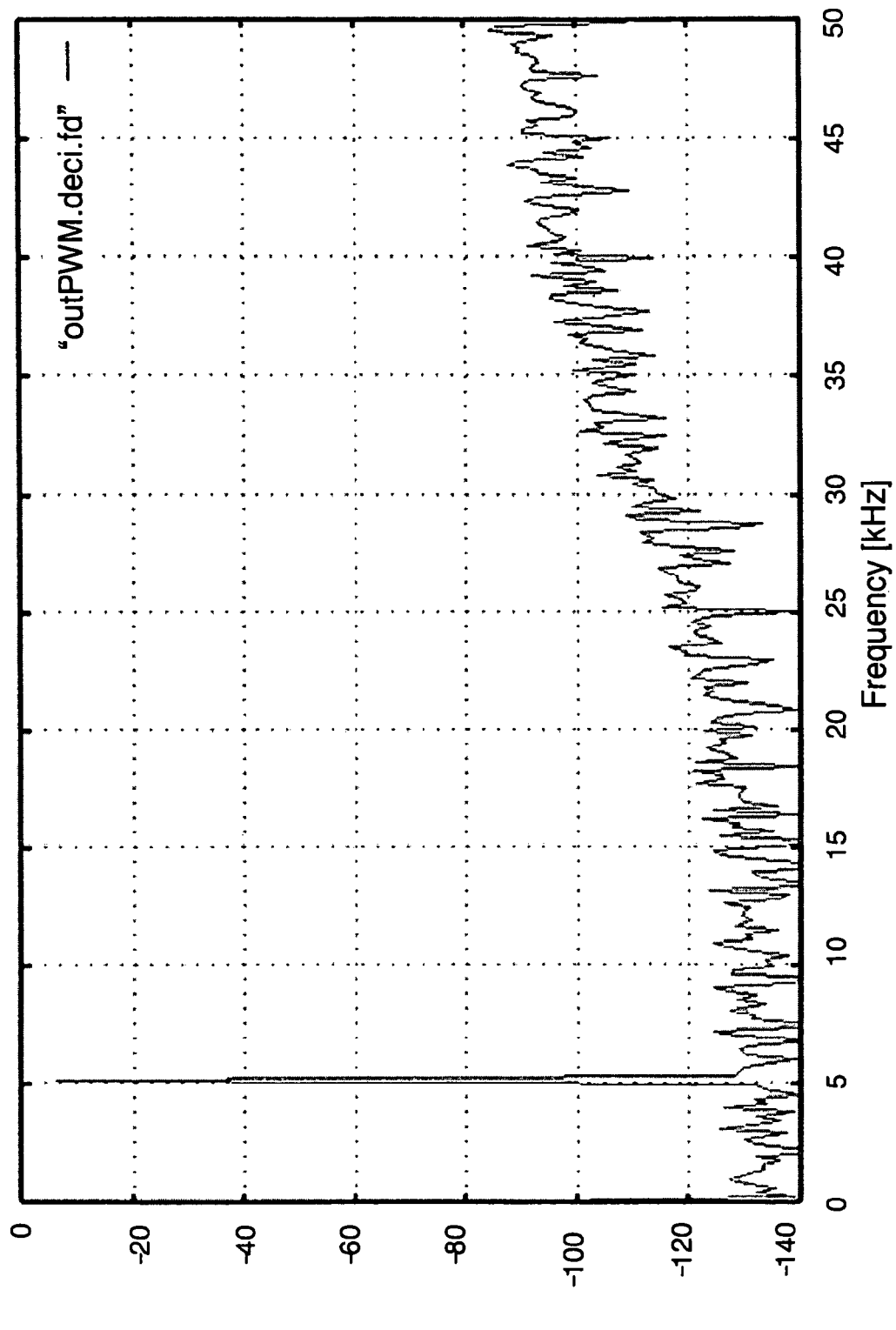
FIG. 11 is a diagram illustrating the result of a simulation according to the present invention.
Figure 12:
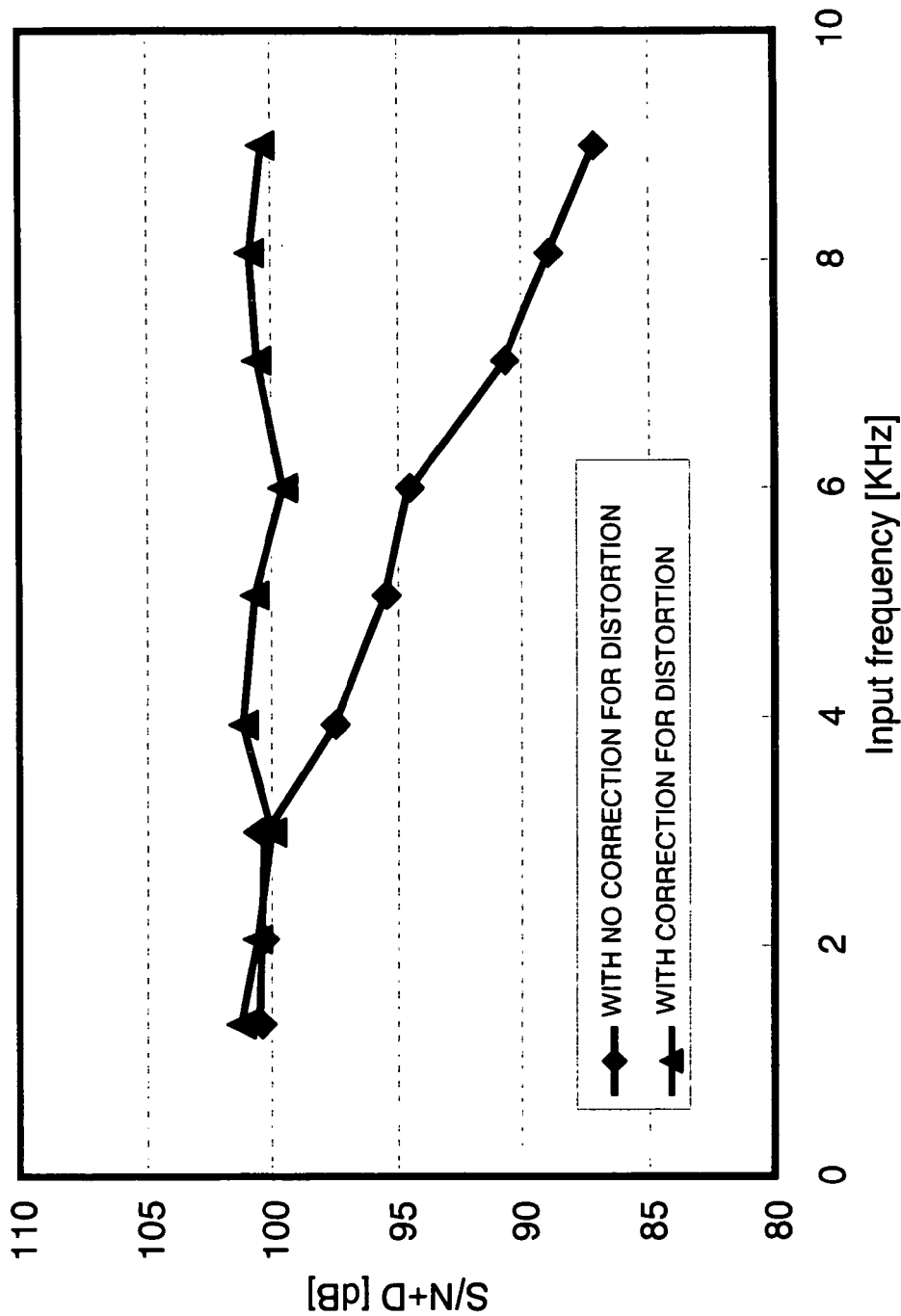
FIG. 12 is a diagram illustrating the dynamic characteristic of a D/A converter according to an example of the present invention and a comparative example.
Figure 13:
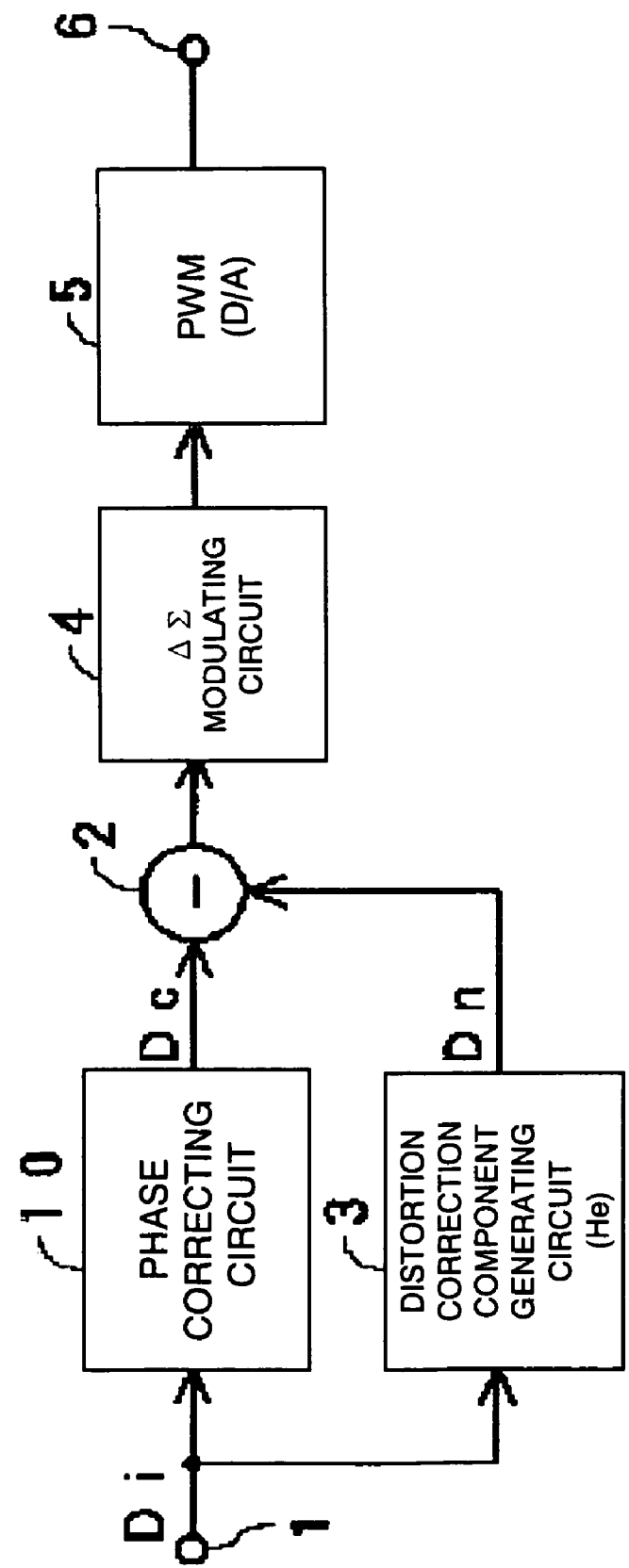
FIG. 13 is a diagram illustrating the configuration of Patent Document 1.
Figure 14:
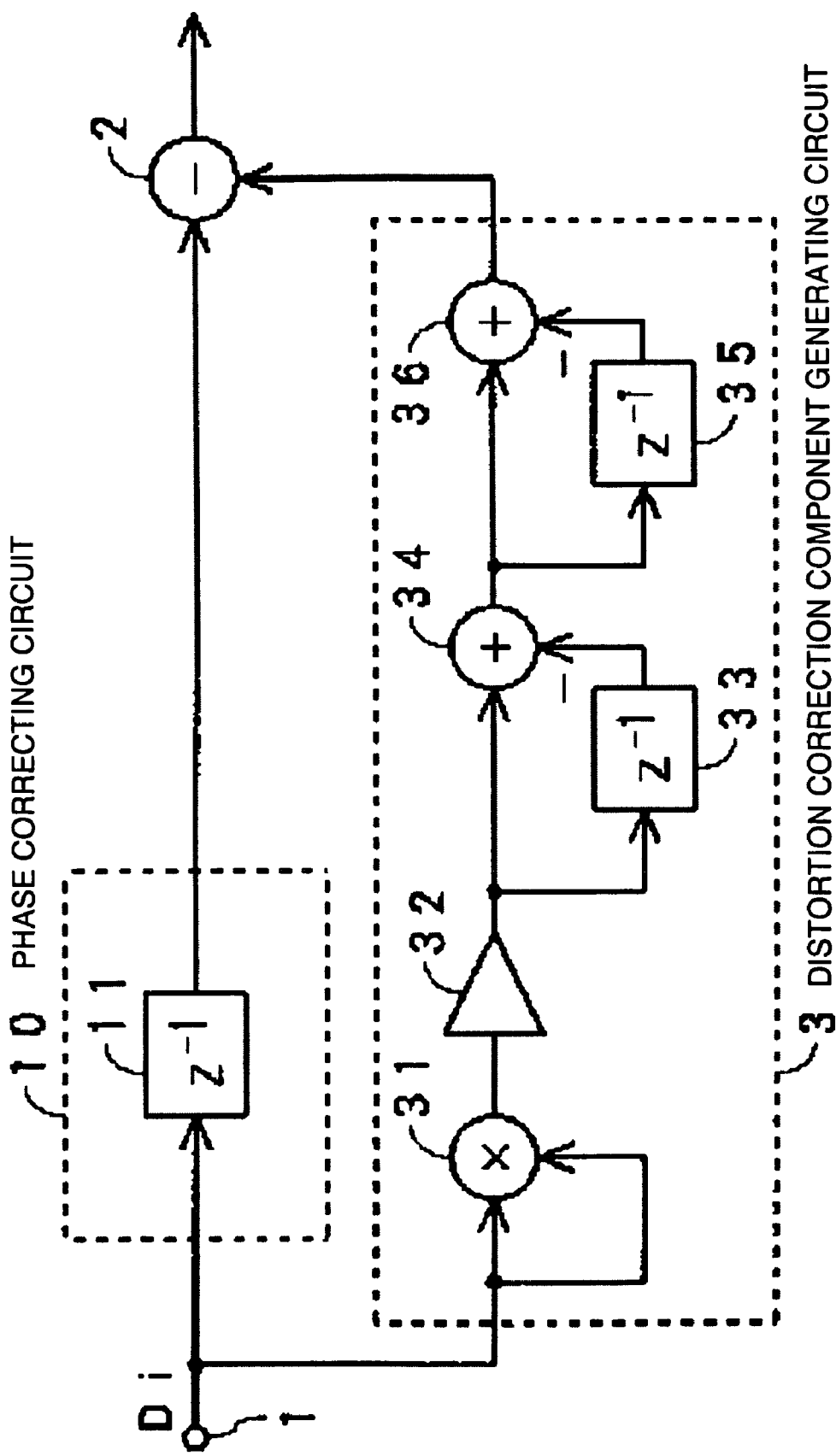
FIG. 14 is a diagram illustrating the configuration of Patent Document 1.
Figure 15:
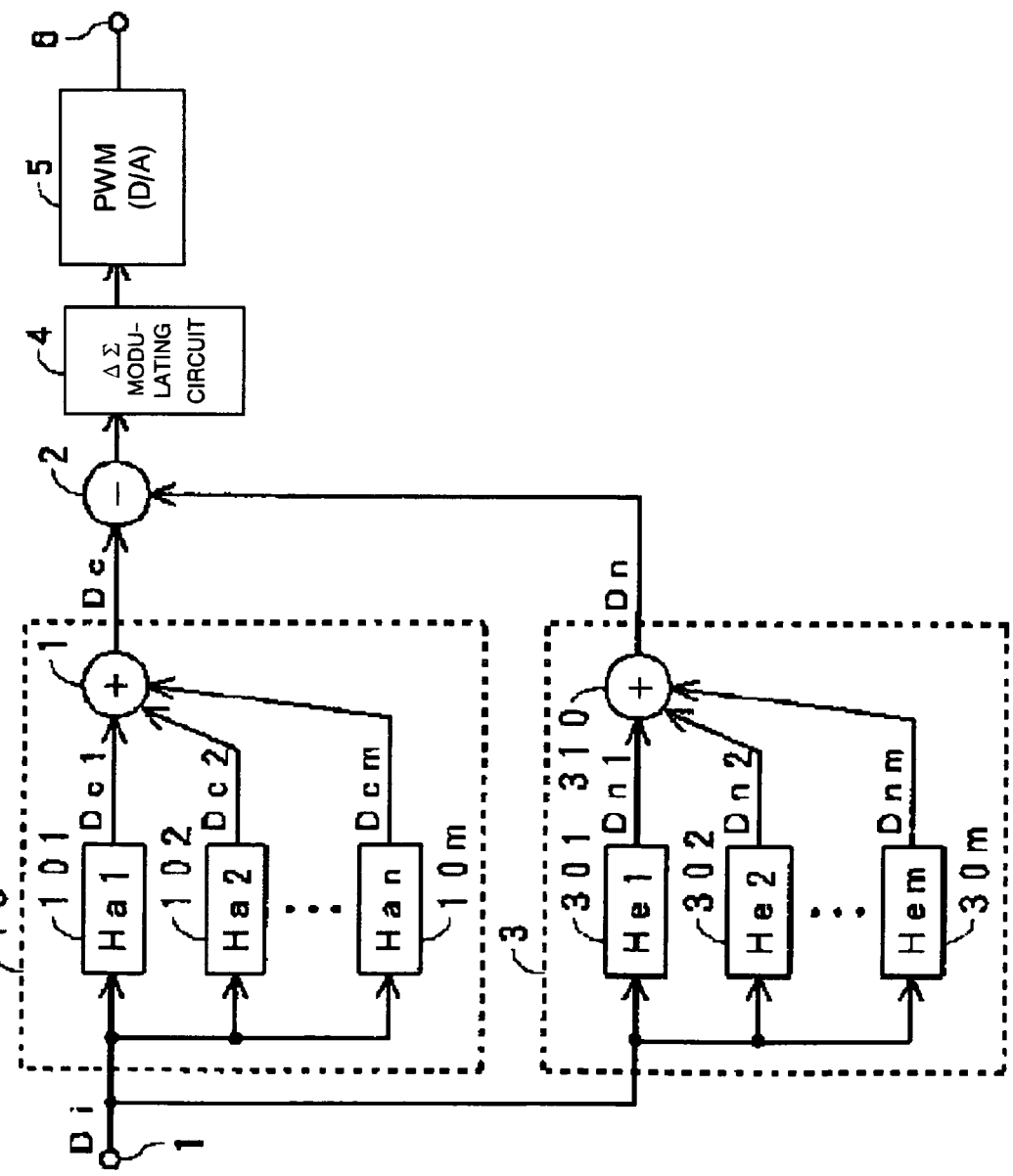
FIG. 15 is a diagram illustrating the configuration of Patent Document 1.

In order to determine the actions and effects of the circuit according to present invention, a simulation was conducted. FIGS. 10 to 12 illustrate the results of the simulation in the case of the circuit according to the present invention and in the case of an example for comparison purposes.

FIG. 10 is a diagram illustrating the frequency spectrum characteristic of a PWM output in a case where a distortion detector according to the present invention has not been provided (i.e., a case where the distortion detector 102 in FIG. 1 has been removed). This is an example for purposes of comparison. A 10-KHz second-order harmonic component appears with respect to 5-KHz signal component.

By contrast, FIG. 11 is a diagram illustrating the frequency spectrum characteristic of a PWM output according to the present invention. As illustrated in FIG. 11, a second-order harmonic component does not appear. Thus it can be verified from FIG. 11 that it is possible to improve upon harmonic distortion. Specifically, it has been confirmed that since the distortion component is extracted using circuitry (DSM and PWM) identical with that of the actual signal processing path, distortion components can be detected accurately.

FIG. 12 is a diagram illustrating the result of simulation of a characteristic of input signal frequency versus S/N+D (signal-to-noise ratio+distortion) at the output of a D/A converter (PWM 114) (where the sampling frequency fs is 48 KHz in the 20-KHz band). FIG. 12 illustrates the dynamic characteristic of the D/A converter (i.e., essentially up to what frequency use is possible).

In FIG. 12, input signal frequency (in units of KHz) is plotted along the horizontal axis and S/N+D (in dB units) is plotted along the vertical axis. The characteristic connecting the triangles is that obtained after correcting for distortion according to the present invention. The characteristic connecting the squares is the example for comparison (no correction for distortion). By correcting for distortion according to the present invention, there is no decline in S/N+D even when the input signal frequency is raised. In the case of the comparison example, on the other hand, an increase in input signal frequency is followed up by a decline in S/N+D.

Though the present invention has been described in accordance with the foregoing examples, the invention is not limited to these examples and it goes without saying that the invention covers various modifications and changes that would be obvious to those skilled in the art within the scope of the claims.

The entire disclosure of Patent Document 1 is incorporated herein by reference thereto. The following analyses are given by the present inventor.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A distortion correction circuit comprising:
    a first circuit including: a delta-sigma modulator that performs delta-sigma modulation of an input signal supplied thereto and outputs the resultant signal; and a pulse-width modulator that receives the signal output from said delta-sigma modulator and outputs a pulse-width-modulated signal having a pulse width corresponding to the received signal;
    a second circuit disposed in front of said first circuit, said second circuit having a configuration identical with or equivalent to that of said first circuit, said second circuit receiving an input signal and subjecting the signal to signal processing identical with or equivalent to that of said first circuit, wherein an output signal of said second circuit includes a distortion component equivalent to a distortion component produced in a case where the input signal is supplied to said first circuit; and
    a circuit that extracts a signal, which includes a distortion component and from which the input signal component is excluded, from the output signal of said second circuit; wherein a signal obtained by subtracting the extracted signal including the distortion component from the input signal is supplied to said first circuit, and said first circuit outputs a signal corrected for the distortion component.

2. The distortion correction circuit according to claim 1, wherein the distortion component includes a harmonic component of the input signal.

3. A digital-to-analog converter including the distortion correction circuit set forth in claim 1.

4. A distortion correction circuit comprising:
    a first circuit including: a delta-sigma modulator that performs delta-sigma modulation of an input signal supplied thereto and outputs the resultant signal; and a pulse-width modulator that receives the signal output from said delta-sigma modulator and outputs a pulse-width-modulated signal having a pulse width corresponding to the received signal;
    a switching circuit that controls switching of an input and output of said first circuit so as to cause said first circuit to perform distortion detection and signal processing in time-shared fashion, wherein an input signal is supplied to said first circuit by said switching circuit, the input signal is subjected to signal processing by said first circuit and the output signal of said first circuit is fed via said switching circuit to a feedback path; and
    a circuit that is provided in the feedback path and extracts a signal, which includes a distortion component and from which the input signal component is excluded, front the output signal of said first circuit; wherein a signal obtained by subtracting the extracted signal including the distortion component from the input signal is supplied via said switching circuit to said first circuit, and said first circuit outputs a signal corrected for the distortion component.

5. The distortion correction circuit according to claim 4, wherein the distortion component includes a harmonic component of the input signal.

6. A digital-to-analog converter including the distortion correction circuit set forth in claim 4.

7. The digital-to-analog converter according to claim 6, comprising:
    the delta-sigma modulator that receives a digital signal, performs delta-sigma modulation of the digital signal and outputs the modulated signal; and the pulse-width modulator that receives a digital signal output from said delta-sigma modulator, and outputs a pulse-width modulated signal having a pulse width conforming to the value of the digital signal, as said first circuit;
    a delay controller that receives the input digital signal, corrects the phase thereof and outputs the resultant signal;
    a first subtractor that subtracts the output of said pulse-width modulator from the output signal of said delta-sigma modulator and outputs the result of subtraction; and
    a second subtractor that subtracts the output of said first subtractor from the output signal of said delay controller and outputs the result of subtraction;
    said digital-to-analog converter further comprising as said switching circuit,
    a first changeover switch that selects one of the input digital signal and output signal of said second subtractor and supplies the selected signal to said delta-sigma modulator; and
    a second changeover switch that delivers the output signal of said pulse-width modulator to one of an output buffer and said first subtractor.

8. The digital-to-analog converter according to claim 7, further comprising:
    a first sampling rate converting circuit that receives the output signal of said delta-sigma modulator and converts a sampling rate of the output signal of said delta-sigma modulator,
    said first subtractor subtracting the output signal of said first sampling rate converting circuit from the output signal of said pulse-width modulator; and
    a second sampling rate converting circuit that receives the output signal of said first subtractor and converts a sampling rate of the output signal of said first subtractor,
    said second subtractor subtracting the output signal of said second sampling rate converting circuit from the output signal of said delay controller and outputting the result of subtraction.

9. The digital-to-analog converter according to claim 8, wherein said first sampling rate converting circuit includes an interpolation filter and said second sampling rate converting circuit includes a decimation filter.

10. The digital-to-analog converter according to claim 7, further comprising a sampling rate converting circuit that receives the output signal of said pulse-width modulator and converts a sampling rate of the output signal of said pulse-width modulator;

wherein said first subtractor subtracts the output signal of said delta-sigma modulator from the output signal of said sampling rate converting circuit and outputs the result of subtraction.

11. The digital-to-analog converter according to claim 10, wherein said sampling rate converting circuit includes a decimation filter.

12. A digital-to-analog converter comprising:
a first delta-sigma modulator that receives a digital signal, performs delta-sigma modulation of the digital signal and outputs the modulated signal;
a first pulse-width modulator that receives a digital signal output from said first delta-sigma modulator, and outputs a pulse-width modulated signal having a pulse width conforming to the value of the digital signal; and
a distortion detector that receives an input digital signal and supplies an output signal to said first delta-sigma modulator;
wherein said distortion detector includes:
a delay controller that receives the input digital signal, corrects the phase thereof and outputs the resultant signal;
a second delta-sigma modulator that receives the input digital signal, performs delta-sigma modulation of the input digital signal and outputs the modulated signal;
a second pulse-width modulator that receives a digital signal output from said second delta-sigma modulator, and outputs a pulse having a pulse width conforming to the value of the digital signal;
a first subtractor that subtracts the output of said second delta-sigma modulator from the output signal of said second pulse-width modulator and outputs the result of subtraction; and
a second subtractor that subtracts the output of said first subtractor from the output signal of said delay controller and outputs the result of subtraction, the output signal of said second subtractor being supplied to aid first delta-sigma modulator.

13. The digital-to-analog converter according to claim 12, wherein said distortion detector includes:
a first sampling rate converting circuit that receives the output signal of said second delta-sigma modulator and converts a sampling rate of the output signal of said second delta-sigma modulator,
said first subtractor subtracting the output signal of said first sampling rate converting circuit from the output signal of said second pulse-width modulator; and
a second sampling rate converting circuit that receives the output signal of said first subtractor and converts a sampling rate of the output signal,
said second subtractor subtracting the output signal of said second sampling rate converting circuit from the output signal of said delay controller and outputting the result of subtraction.

14. The digital-to-analog converter according to claim 13, wherein said distortion detector includes a sampling rate converting circuit that receives the output signal of said second pulse-width modulator and converts a sampling rate of the output signal,
said first subtractor subtracting the output signal of said second delta-sigma modulator from the output signal of said sampling rate converting circuit and outputting the result of subtraction.

15. The digital-to-analog converter according to claim 14, wherein said sampling rate converting circuit includes a decimation filter.

16. The digital-to-analog converter according to claim 13, wherein said first sampling rate converting circuit includes an interpolation filter and said second sampling rate converting circuit includes a decimation filter.

17. The digital-to-analog converter according to claim 12, wherein said first and second delta-sigma modulators have identical configurations, and said first and second pulse-width modulators have identical configurations.

* * * * *